United States Patent
Krysak et al.

(10) Patent No.: US 11,874,600 B2
(45) Date of Patent: *Jan. 16, 2024

(54) LIGAND-CAPPED MAIN GROUP NANOPARTICLES AS HIGH ABSORPTION EXTREME ULTRAVIOLET LITHOGRAPHY RESISTS

(71) Applicant: Intel Corporation, Santa Clara, CA (US)

(72) Inventors: Marie Krysak, Portland, OR (US); James M. Blackwell, Portland, OR (US); Robert L. Bristol, Portland, OR (US); Florian Gstrein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 17/712,953

(22) Filed: Apr. 4, 2022

(65) Prior Publication Data

US 2022/0229364 A1    Jul. 21, 2022

Related U.S. Application Data

(62) Division of application No. 16/316,594, filed as application No. PCT/US2016/054953 on Sep. 30, 2016, now Pat. No. 11,320,734.

(51) Int. Cl.
*G03F 7/004* (2006.01)
*G03F 7/20* (2006.01)
(Continued)

(52) U.S. Cl.
CPC .......... *G03F 7/0043* (2013.01); *G03F 7/2004* (2013.01); *B82Y 30/00* (2013.01); *B82Y 40/00* (2013.01); *G03F 7/0048* (2013.01)

(58) Field of Classification Search
CPC ........ G03F 7/0042; G03F 7/26; G03F 7/0043; G03F 7/0048
See application file for complete search history.

(56) References Cited

U.S. PATENT DOCUMENTS 11,320,734 B2* 5/2022 Krysak ................. G03F 7/2004
2004/0253536 A1* 12/2004 Park ....................... G03F 7/027
430/322

(Continued)

OTHER PUBLICATIONS

International Search Report and Written Opinion for International Patent Application No. PCT/US2016/054953 dated Jun. 30, 2017, 11 pgs.

(Continued)

*Primary Examiner* — Daborah Chacko-Davis
(74) *Attorney, Agent, or Firm* — Schwabe, Williamson & Wyatt, P.C.

(57) ABSTRACT

A photosensitive composition including metal nanoparticles capped with an organic ligand, wherein the metal particles includes a metal that absorbs light in the extreme ultraviolet spectrum. A method including synthesizing metal particles including a diameter of 5 nanometers or less, wherein the metal particles includes a metal that absorbs light in the extreme ultraviolet spectrum; and capping the metal particles with an organic ligand. A method including depositing a photosensitive composition on a semiconductor substrate, wherein the photosensitive composition includes metal nanoparticles capped with an organic ligand and the nanoparticles include a metal that absorbs light in the extreme ultraviolet spectrum; exposing the photosensitive composition to light in an ultraviolet spectrum through a mask including a pattern; and transferring the mask pattern to the photosensitive composition.

14 Claims, 7 Drawing Sheets

(51) Int. Cl.
 *B82Y 30/00* (2011.01)
 *B82Y 40/00* (2011.01)

(56) References Cited

U.S. PATENT DOCUMENTS

| | | |
|---|---|---|
| 2006/0046480 A1 | 3/2006 | Guo |
| 2008/0206562 A1 | 8/2008 | Stucky |
| 2011/0039105 A1 | 2/2011 | Zimmerman et al. |
| 2015/0234272 A1 | 8/2015 | Sarma et al. |
| 2016/0375496 A1 | 12/2016 | Hur |
| 2017/0031244 A1 | 2/2017 | Thackeray |

OTHER PUBLICATIONS

Li, Li et al., Solubility studies of inorganic-organic hybrid nanoparticle photoresists with different surface functional groups, Nanoscale, Dec. 15, 2015 (e-pub), vol. 8, No. 3, pp. 1338-1343 See pp. 1338-1340.

Li, Li et al., Studying the mechanism of hybrid nanoparticle photoresists: effect of particle size on photopatterning, Chemistry of Materials, 2015, vol. 27, No. 14, pp. 5027-5031 See abstract; and pp. 5027-5029.

Sahraneshin, Ameneh et al., "Synthesis of shape-controlled and organic-hybridized hafnium oxide nanoparticles under sub- and supercritical hydrothermal conditions," The Journal of Supercritical Fluids, 2012, vol. 62, pp. 190-196 See abstract; and pp. 190-192.

International Preliminary Report on Patentability for International Patent Application No. PCT/US2016/054953 dated Apr. 11, 2019, 11 pgs.

\* cited by examiner

LIGAND-CAPPED MAIN GROUP NANOPARTICLES AS HIGH ABSORPTION EXTREME ULTRAVIOLET LITHOGRAPHY RESISTS

CROSS-REFERENCE TO RELATED APPLICATION

This patent application is divisional of U.S. patent application Ser. No. 16/316,594, filed Jan. 9, 2019, which is a U.S. National Phase application under 35 U.S.C. § 371 of International Application No. PCT/US2016/054953, filed Sep. 30, 2016, entitled "LIGAND-CAPPED MAIN GROUP NANOPARTICLES AS HIGH ABSORPTION EXTREME ULTRAVIOLET LITHOGRAPHY RESISTS," which designates the United States of America, the entire disclosure of which are hereby incorporated by reference in their entirety and for all purposes.

BACKGROUND

Field

Integrated circuit processing.

Description of Related Art

State of the art photoresist used in the development and manufacturing processes are often made up of mainly organic polymers mixed with or attached to a photoacid generator. The photoacid generator diffuses after ultraviolet (UV) light exposure to catalyze reactions to enable a solubility switch, such as rendering portions of the photoresist exposed to UV light exposure less soluble or insoluble in a developer. Inhomogeneous acid distribution or photo-labile polymer groups can lead to insufficient acid or reactive sites in certain areas of a substrate such as a semiconductor wafer, resulting in a feature that does not print or a defect.

DETAILED DESCRIPTION

Figure 1:
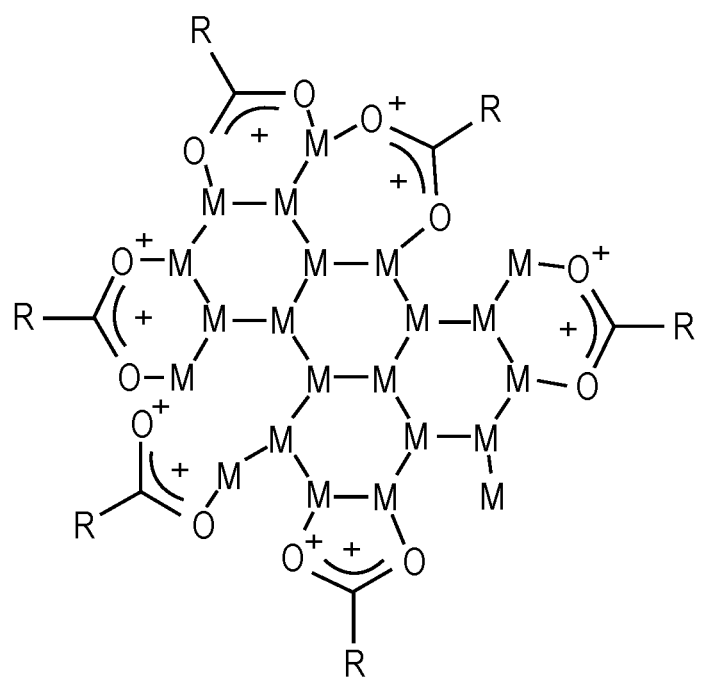
FIG. 1 shows an atomic representation of a metal nanoparticles capped with an organic ligand.

A photosensitive composition is disclosed. In one embodiment, the photosensitive composition includes metal nanoparticles capped with an organic ligand wherein the metal particles include a metal that absorbs light in the extreme ultraviolet (EUV) spectrum. The extreme ultraviolet spectrum includes light with a wavelength on the order of 30 nanometers or less, in another embodiment, 20 nanometers or less, and in another embodiment, in the range of 11 nanometers to 14 nanometers (e.g., about 13.5 nanometers). In one embodiment, the photosensitive composition is suitable in lithography to form three dimensional relief images on an integrated circuit substrate for subsequent transfer of the image (pattern) to the substrate. A method of use of the photosensitive composition as a photoresist is also described.

In one embodiment, the photosensitive composition includes metal nanoparticles capped with an organic ligand where the metal nanoparticles have an average diameter of 5 nanometers (nm) or less and a size distribution on the order of plus or minus (+/−) 1 nm. Suitable metals for the metal particles include metals that have EUV absorbance characteristics. An EUV absorbance characteristic is the ability of a metal to absorb photons in the EUV spectrum and generate secondary electrons. Such metals include, but are not limited to, bismuth, indium, antimony, germanium, aluminum and tin. Nanoparticle clusters of bismuth, indium, antimony, germanium, aluminum, or tin can be synthesized from a variety of methods. In one embodiment, following synthesis, these nanoparticle clusters of 5 nm or less are capped or end capped on a surface with organic ligands. The capping tends to stabilize the clusters to prevent aggregation or agglomeration of the particle size (e.g., to prevent an increase in particle size) which can shift base line resist performance and cause defects on, for example, an integrated circuit substrate such as a wafer. The small size of the nanoparticles (average diameter of 5 nm or less) and their relatively narrow size distribution (+/−1 nm) tend to limit variability in metal to ligand ratio/resist stochastics. Examples of organic ligands include C1-C10 moeities that may be saturated (e.g., an alkyl), branched (e.g., an isoalkyl) or substituted (e.g., carbon atoms substituted with oxygen atoms). The ligands may be bound to a metal through a carboxylate where oxygen atoms of the carboxylate are coordinated to metal atoms or through a direct metal to carbon bond. Suitable organic ligands also include ligands that may be photosensitive and decompose or crosslink upon EUV exposure to cause a solubility switch in a resist film. In one embodiment, a capping ligand initially bound to a nanoparticle may be replaced with an organic ligand such as a C1-C10 ligand that may or may not contain a photoreactive moiety such as a pendant hydroxyl, vinyl or phenyl group. The replacement organic ligands can be introduced to a surface of the particles via a ligand exchange. Ligands with pendent photoreactive groups (e.g., hydroxyl, vinyl, phenyl group) can crosslink upon exposure to EUV. Representatively, organic ligands of pendent vinyl groups can crosslink via radical formation from ionization of the metal. Ligand fragmentation may also occur which can lead to metal-to-metal crosslinking or particle aggregation. Such changes will lead to a change in solubility of the exposed photosensitive composition (e.g., making the photosensitive composition less soluble to a photoresist developer). Representative carboxylic acid ligands that may be coordinated to metal nanoparticles through a carboxylate, either initially or as replacement ligands include, but are not limited to, methacrylic acid, acetic acid, isobutyric acid, benzoic acid, 4-vinylbenzoic acid, proptonic acid, tiglic acid and dimethacrylic acid.

FIG. 1 shows an atomic representation of a metal nanoparticle cluster capped with an organic ligand. In FIG. 1, M represents a metal such as bismuth, indiu, antimony, germanium, aluminum or tin, O is oxygen and R is an organic ligand.

Figure 2:
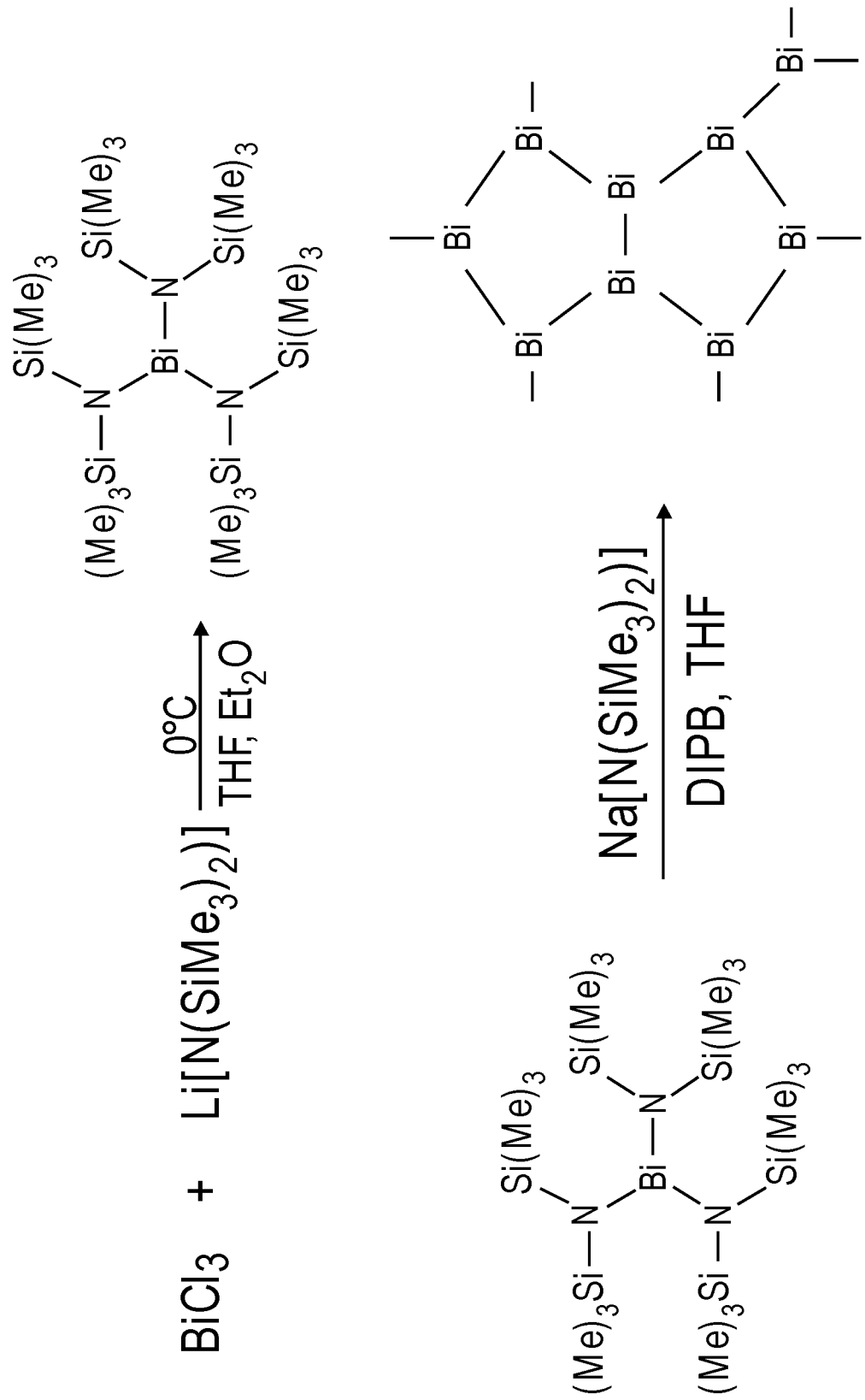
FIG. 2 shows a representative synthesis of bismuth nanoparticles from bismuth chloride.

Bismuth nanoparticles can be synthesized by reducing Bi[N(SiMe3)2] to elemental Bi via a reducing agent. FIG. 2 shows a representative synthesis of bismuth nanoparticles from bismuth chloride. In this reaction, bismuth chloride is reacted with a lithium bis(trimethylsilyl) amide in the presence of tetrahydrofuran (THF) and diethyl ether (Et2O) at 0° C. to form bismuth (trimethylsilyl) amide. The bismuth bis(trimethylsilyl) amide is then reacted with sodium bis (trimethylsilyl) amide in the presence of THF and diisopropylbenzene (DIPF) to form bismuth nanoparticles. A representative size of the bismuth nanoparticle clusters produced is on the order of 3.3 nm+/–0.6 nm. After forming bismuth nanoparticle clusters, an organic ligand or ligands (e.g., C1-C10 ligands) are added as capping agents to prevent particle aggregation. A representative capping agent is oleic acid. Similarly, sub-10 nm indium nanoparticles can be synthesized by reducing indium trichloride in isobutylamine, and capped with trioctylphosphine to prevent aggregation. Photo- or radical-sensitive ligands (e.g., ligands with pendant hydroxyl, vinyl, phenyl groups) can be introduced to the surface of the particles via ligand exchange. Representatively, a solution of bismuth or indium nanoparticle clusters capped on a surface with oleic acid ligands can undergo a ligand exchange reaction when exposed to an excess of, for example, photosensitive molecules (e.g., carboxylic acids with pendant hydroxyl, vinyl or phenyl groups). The excess of the photosensitive ligands will replace the oleic acid ligands on the surface of the nanoparticle clusters. In response to EUV exposure, pendant vinyl groups can crosslink via radical formation from ionization of bismuth or indium. Ligand fragmentation may also occur, which can lead to M-M crosslinking or particle aggregation. These chemical changes can lead to a change in solubility of an exposed photosensitive composition as a photoresist.

Figure 3:
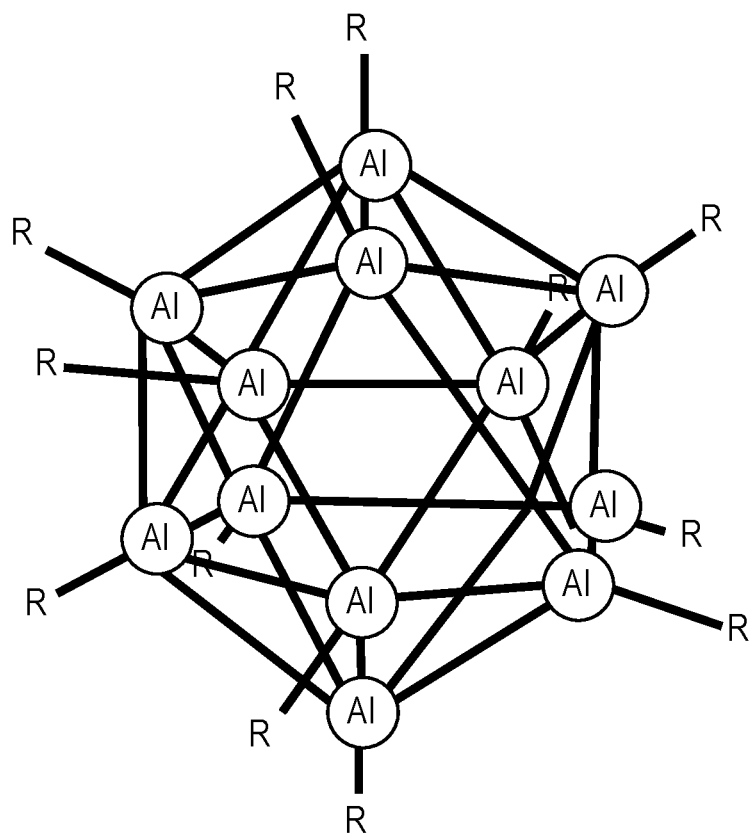
FIG. 3 shows an atomic representation of an aluminum nanoparticle capped with an organic ligand.

Aluminum clusters can be synthesized via reduction of organoaluminum halides (RAlX2, R2AlX). R can be a variety of organic ligands such as, but not limited to, short chain alkyl substituents (e.g., C2-C10 alkyls) designed to crosslink similar to the above-mentioned organic ligands. FIG. 3 shows an atomic representation of a cluster. These organometallic clusters are discrete molecules, with the same number of core atoms and organic ligands per molecule. In the embodiment shown in FIG. 3, there are 12 aluminum atoms and 12 ligands. A size distribution of molecules in a resist film of these aluminum nanoparticle clusters will impact resist stochastics. In an embodiment where there are the same number of atoms in each cluster, there will be little to no variation in resist component across a substrate such as wafer.

Figure 4:
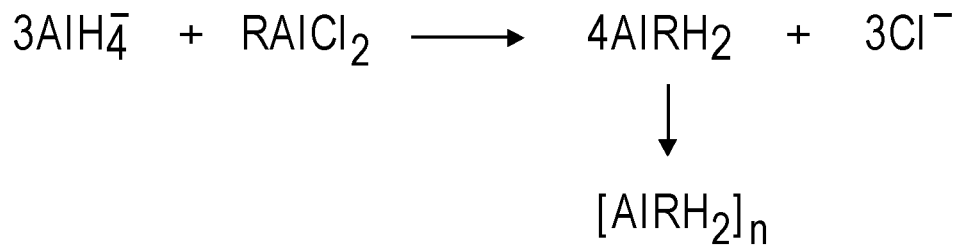
FIG. 4 shows a representative synthesis of aluminum nanoparticles.

FIG. 4 shows a representative synthesis of aluminum nanoparticles. In FIG. 4, the nanoparticles are synthesized through a reduction of an organoaluminum chloride. The organoaluminum chloride (RAlCl2) is reacted with an aluminum hydride to produce an organoaluminum hydride with an open site. The organoaluminum hydride is produced then combine to form a nanoparticle cluster.

Figure 5:
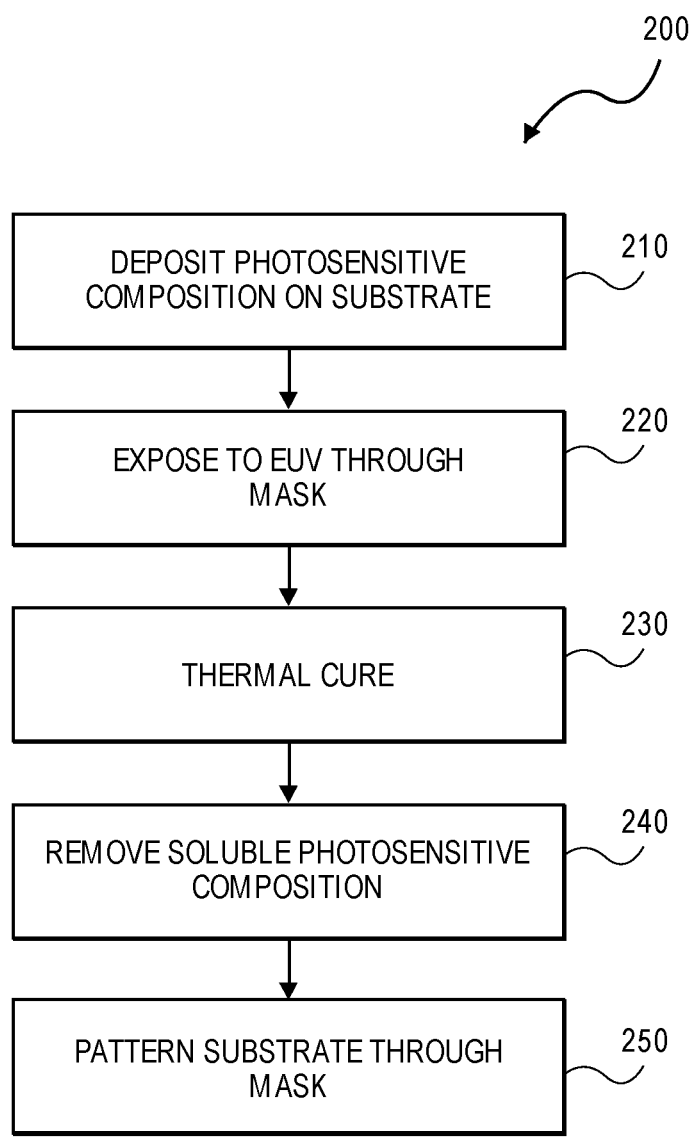
FIG. 5 presents a flow chart of a method of use of a photosensitive composition described herein as a photoresist in an EUV photolithography process.

FIG. 5 presents a flow chart of a method of use of a photosensitive composition described herein as a photoresist in an EUV photolithography process. Referring to FIG. 5, process 200 describes depositing a photosensitive composition on a substrate such as a silicon wafer (block 210). On the substrate there may be a number of defined integrated circuit chips at some point in the fabrication process where it is desired to pattern a layer or layers on the substrate in a particular fashion. It is appreciated that the fabrication of complex structures that make up transistors of an integrated circuit and the many wires or traces that connect millions of transistors may involve numerous lithography and etch transfer pattern operations. The deposition of a photosensitive composition according to the method of FIG. 5 may be done for any of these operations. In one embodiment, a photosensitive composition such as described above is dispersed in a casting solvent and deposited on a circuit substrate by a spin on process. Following the deposition of the photosensitive composition on a substrate, the photosensitive composition is exposed to EUV radiation through a mask (block 220). The EUV radiation will modify a solubility of the photosensitive composition. In one sense, modifying a solubility means rendering the photosensitive composition less soluble in a developer. Representatively, the EUV radiation modifies a photosensitive composition by encourage crosslinking or agglomeration of the metal particles in the composition as well as possible crosslinking of photosensitive ligands.

Figure 6:
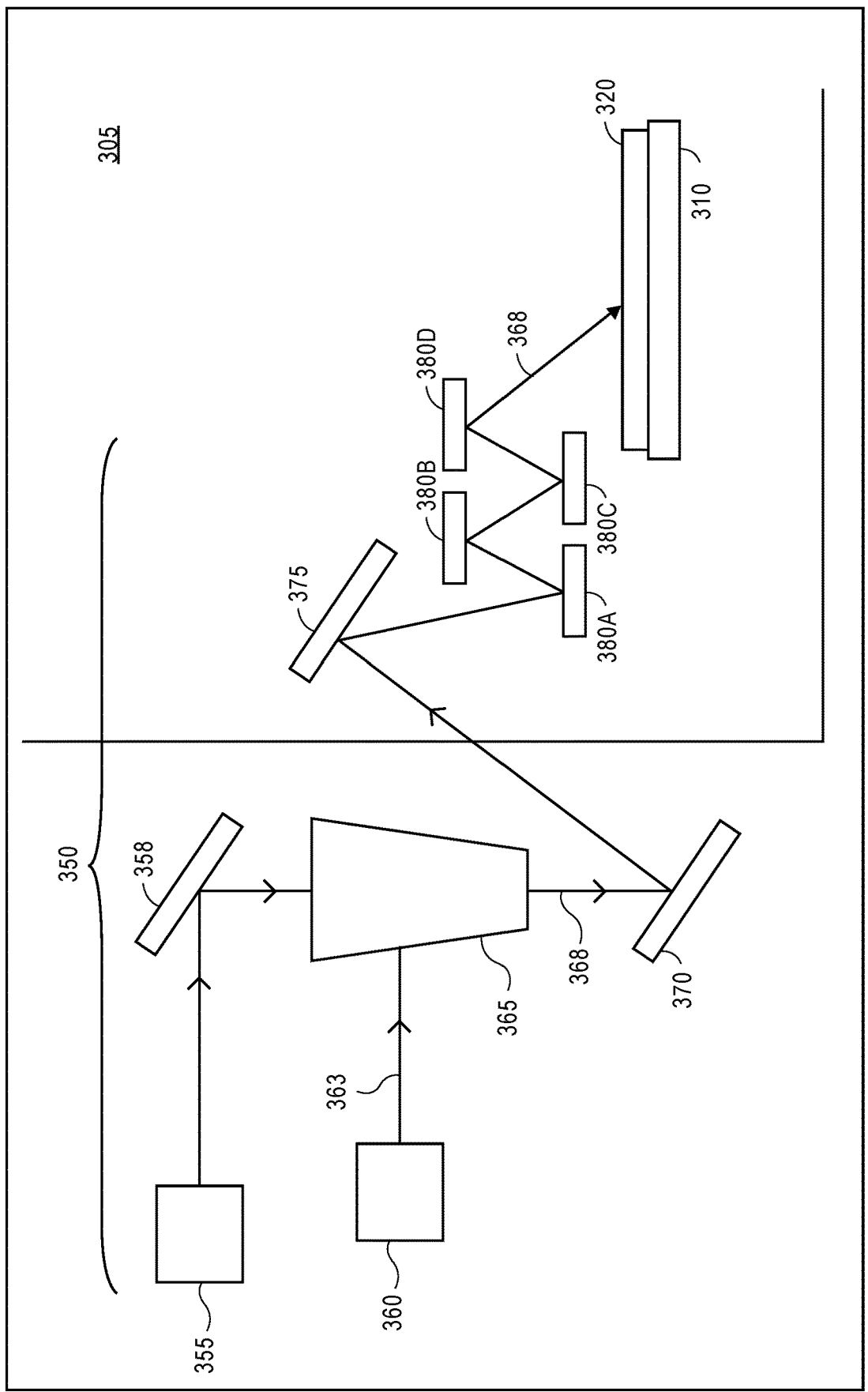
FIG. 6 shows a schematic representation of a substrate and an EUV lithography system.

FIG. 6 shows a schematic representation of a substrate and an EUV lithography system. Referring to FIG. 6, the illustration shows substrate 310 in, for example, chamber 305. Disposed on a surface of substrate 310 is photosensitive composition 320. In one embodiment, photosensitive composition 320 includes metal nanoparticles capped with an organic ligand wherein the metal particles include a metal that absorbs light in the EUV spectrum. Examples of metals that absorb light in the EUV spectrum include bismuth, indium, antimony, germanium, aluminum and tin. EUV system 350, in this embodiment, includes infrared laser 355, xenon plasma source 360 and condenser mirror source 365. In one embodiment, to obtain radiation in the EUV (e.g., 13.4 nm) a stream of xenon gas from xenon gas source 360 is excited with electromagnetic radiation from ion laser source 355. FIG. 6 shows electromagnetic radiation from laser source 355 being directed by mirror 358 to contact xenon beam 363. The excited beam is condensed in condensing mirror system 365 into EUV radiation 368. EUV radiation 368 is then directed by mirror 370 to mask 375. In one embodiment, mask 375 includes a desired pattern to limit the amount and location of EUV radiation that will contact photosensitive composition contact layer 320 on substrate 310. From mask 375, EUV radiation 368 is directed through a reduction mirror system (illustrated by mirror 380A, 380B, 380C and mirror 380D) made up of materials of contrasting dielectric constant. Ultimately, EUV radiation 368 contacts layer 320. The EUV radiation directed at layer 320 matches the pattern on mask 375.

Referring again to FIG. 5, following the exposure of a photosensitive composition to EUV radiation, the composition on a substrate is thermally cured (block 230). A representative cure temperature is on the order of 250° C. to 400° C. The thermal cure tends to drive crosslinking of the metal particles toward, for example, on film that is insoluble in a developer.

Following a thermal cure, portions of the photosensitive composition that were not modified by the EUV radiation are removed (block 240). In one example, the EUV radiation modifies a photosensitive composition by encouraging crosslinking of the metal particles therein. In such an embodiment, the modification renders that portion of a layer or film of the composition less soluble to a developer. Accordingly, to remove the portions that were not modified, the substrate may be exposed to a developer to wash away such portions (e.g., to wash away the uncrosslinked material). A representative developer is an organic solvent, such as organic alcohols (isopropyl alcohol, methyl isobutyl carbinol, etc.) or 2-heptanone. The result is a pattern of the photosensitive composition on a surface of the substrate.

The pattern may then be transferred to the substrate by, for example, an etching operation (block 250).

Figure 7:
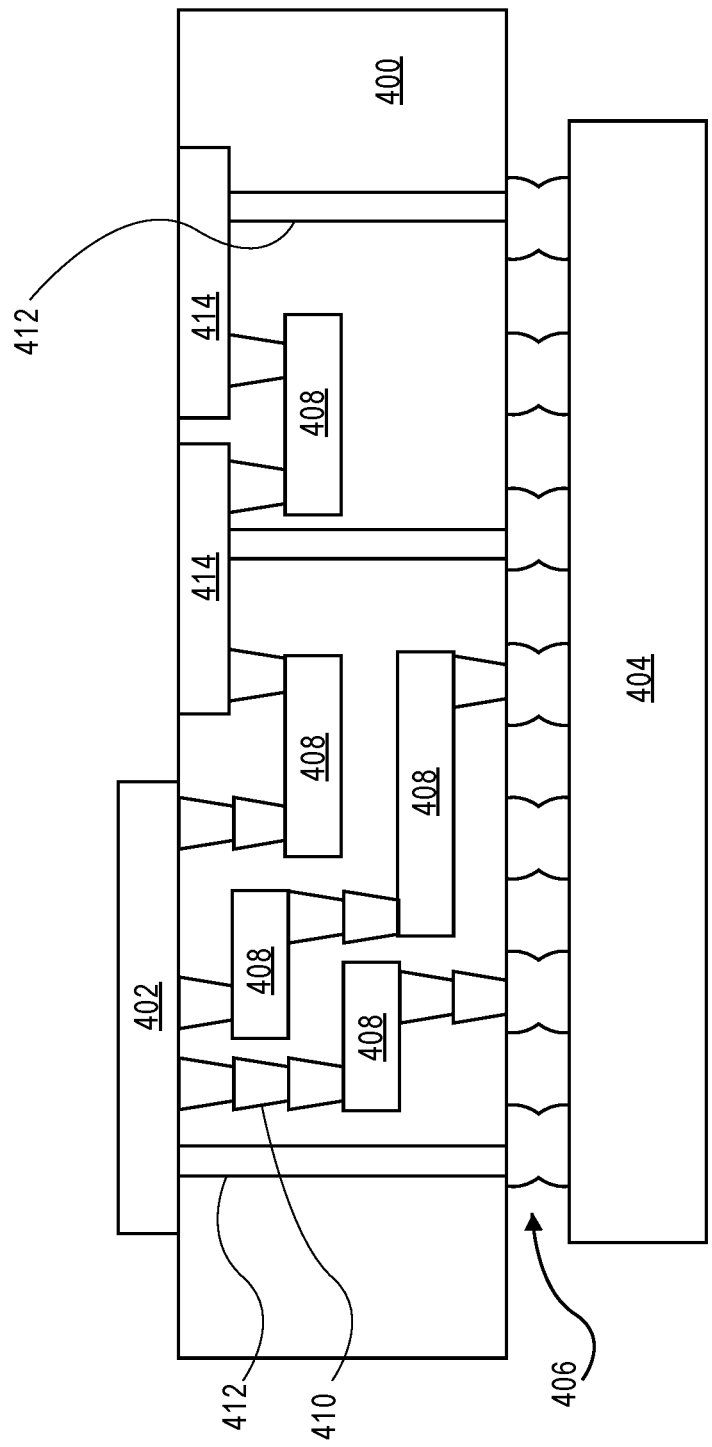
FIG. 7 is an interposer implementing one or more embodiments.

FIG. 7 illustrates interposer 400 that includes one or more embodiments. Interposer 400 is an intervening substrate used to bridge a first substrate 402 to second substrate 404. First substrate 402 may be, for instance, an integrated circuit die. Second substrate 404 may be, for instance, a memory module, a computer motherboard, or another integrated circuit die. Generally, the purpose of interposer 400 is to spread a connection to a wider pitch or to reroute a connection to a different connection. For example, interposer 400 may couple an integrated circuit die to ball grid array (BGA) 406 that can subsequently be coupled to second substrate 404. In some embodiments, first and second substrates 402/404 are attached to opposing sides of interposer 400. In other embodiments, first and second substrates 402/404 are attached to the same side of interposer 400. In further embodiments, three or more substrates are interconnected by way of interposer 400.

Interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. Interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 400.

In accordance with embodiments, apparatuses or processes disclosed herein may be used in the fabrication of interposer 400.

Figure 8:
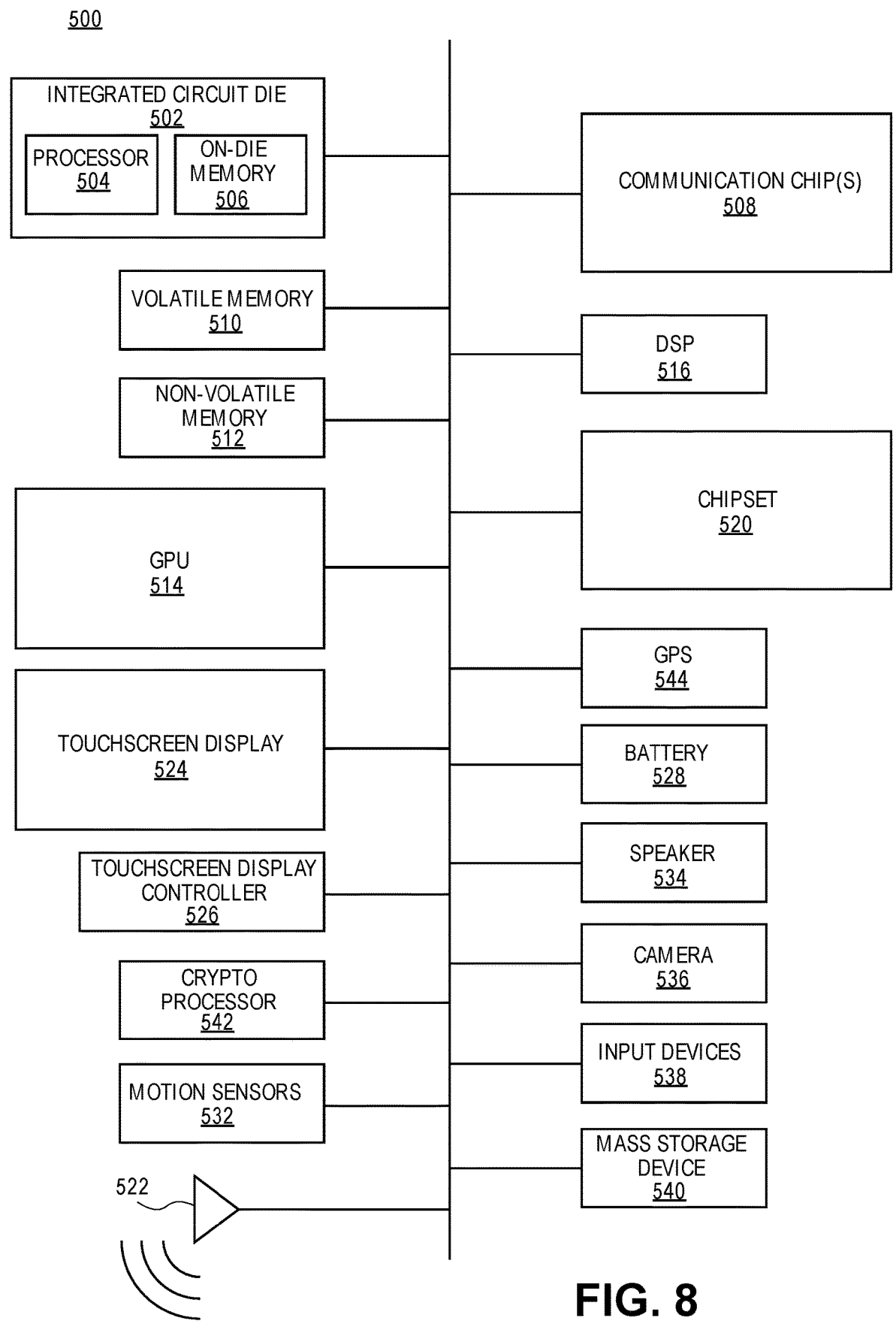
FIG. 8 illustrates an embodiment of a computing device.

FIG. 8 illustrates computing device 500 in accordance with one embodiment. Computing device 500 may include a number of components. In one embodiment, these components are attached to one or more motherboards. In an alternate embodiment, these components are fabricated onto a single system-on-a-chip (SoC) die rather than a motherboard. The components in computing device 500 include, but are not limited to, integrated circuit die 502 and at least one communication chip 508. In some implementations communication chip 508 is fabricated as part of integrated circuit die 502. Integrated circuit die 502 may include CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), graphics processing unit 514 (GPU), digital signal processor 516, crypto processor 542 (a specialized processor that executes cryptographic algorithms within hardware), chipset 520, antenna 522, display or a touchscreen display 524, touchscreen controller 526, battery 528 or other power source, a power amplifier (not shown), global positioning system (GPS) device 544, compass 530, motion coprocessor or sensors 532 (that may include an accelerometer, a gyroscope, and a compass), speaker 534, camera 536, user input devices 538 (such as a keyboard, mouse, stylus, and touchpad), and mass storage device 540 (such as hard disk drive, compact disk (CD), digital versatile disk (DVD), and so forth).

Communications chip 508 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 504 of computing device 500 includes one or more devices, such as transistors or metal interconnects, that are formed in accordance with embodiments presented above utilizing a photosensitive composition as a photolithography process to form such one or more devices. The term "processor" may refer to any device or portion of a device that processes electronic data from registers and/or memory to transform that electronic data into other electronic data that may be stored in registers and/or memory.

Communication chip 508 may also include one or more devices, such as transistors or metal interconnects, that are formed in accordance with embodiments presented above utilizing a photosensitive composition as a photolithography process to form such one or more devices.

In further embodiments, another component housed within computing device 500 may contain one or more devices, such as transistors or metal interconnects, that are formed in accordance with implementations presented above utilizing a photosensitive composition as a photolithography process to form such one or more devices.

In various embodiments, computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

Examples

Example 1 is a photosensitive composition including metal nanoparticles capped with an organic ligand, wherein the metal particles includes a metal that absorbs light in the extreme ultraviolet spectrum.

In Example 2, the metal particles of the photosensitive composition of Example 1 include a metal selected from bismuth, indium, antimony, germanium, aluminum and tin.

In Example 3, the metal nanoparticles of the photosensitive composition of Example 1 or 2 includes an average diameter of 5 nanometers or less.

In Example 4, a size distribution of the metal nanoparticles of the photosensitive composition of Example 3 include a size distribution of plus or minus one nanometer.

In Example 5, the organic ligand of the photosensitive composition of any of Examples 1-4 is operable to decompose or crosslink upon exposure to ultraviolet light.

In Example 6, the organic ligand of the photosensitive composition of Example 5 includes a C1-C10 moiety that may contain a pendant hydroxyl, vinyl or phenyl group.

In Example 7, the photosensitive composition of any of Examples 1-6 further includes a casting solvent, wherein the metal oxide particles are dispersed in the casting solvent.

Example 8 is a method including synthesizing metal particles including a diameter of 5 nanometers or less, wherein the metal particles includes a metal that absorbs light in the extreme ultraviolet spectrum; and capping the metal particles with an organic ligand.

In Example 9, synthesizing of the method of Example 8 includes reducing a metal silane.

In Example 10, synthesizing of the method of Example 8 includes reducing a metal halide.

In Example 11, the metal particles of the method of any of Examples 8-10 include a metal selected from bismuth, indium, antimony, germanium, aluminum and tin.

In Example 12, the organic ligand of the method of any of Examples 8-11 is operable to decompose or cross-link upon exposure to light in the extreme ultraviolet spectrum.

In Example 13, the organic ligand of the method of Example 11 includes a C1-C10 moiety that may contain a pendent hydroxyl, vinyl or phenyl group.

In Example 14, the method of any of Examples 8-13 further includes dispersing the capped metal particles in a casting solvent.

In Example 15, the method of Example 14 further includes depositing the dispersed capped metal particles as a composition on a semiconductor substrate and thermally curing.

In Example 16, a size distribution of the synthesized metal nanoparticles of the method of Example 8 includes a size distribution of plus or minus one nanometers.

Example 17 is a method including depositing a photosensitive composition on a semiconductor substrate, wherein the photosensitive composition includes metal nanoparticles capped with an organic ligand and the nanoparticles include a metal that absorbs light in the extreme ultraviolet spectrum; exposing the photosensitive composition to light in an ultraviolet spectrum through a mask including a pattern; and transferring the mask pattern to the photosensitive composition.

In Example 18, transferring the mask pattern to the photosensitive composition of the method of Example 17 includes modifying a solubility of a portion of the photosensitive composition for a developer.

In Example 19, modifying a solubility of a portion of the photosensitive composition for a developer of the method of Example 18 includes rendering the portion insoluble for the developer.

In Example 20, the method of Example 19 further includes after modifying a solubility of a portion of the photosensitive composition, removing an unmodified portion of the photosensitive composition.

In Example 21, the metal particles of the method of Example 17 include a metal selected from bismuth, indium, antimony, germanium, aluminum and tin.

In Example 22, the organic ligand of the method of Example 17 includes a C1-C10 moiety that may contain a pendent hydroxyl, vinyl or phenyl group.

In Example 23, the photosensitive composition of the method of Example 17 further includes a casting solvent and prior to exposing the photosensitive composition to light in the ultraviolet spectrum, the method includes thermally curing the photosensitive composition.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method comprising:
   depositing a photosensitive composition on a semiconductor substrate, wherein the photosensitive composition comprises metal nanoparticles capped with an organic ligand and the metal nanoparticles comprise a metal species (M) that absorbs light in the extreme ultraviolet spectrum, and wherein each of the metal nanoparticles comprises a six-membered —M—M—M—M —M—M— ring;
   exposing the photosensitive composition to light in an ultraviolet spectrum through a mask comprising a pattern; and
   transferring the mask pattern to the photosensitive composition.

2. The method of claim 1, wherein the transferring the mask pattern to the photosensitive composition comprises modifying a solubility of a portion of the photosensitive composition for a developer.

3. The method of claim 2, wherein the modifying a solubility of a portion of the photosensitive composition for a developer comprises rendering the portion insoluble for the developer.

4. The method of claim 3, further comprising after the modifying a solubility of a portion of the photosensitive composition, removing an unmodified portion of the photosensitive composition.

5. The method of claim 1, wherein the metal species (M) of the metal particles is selected from bismuth, indium, antimony, germanium, aluminum and tin.

6. The method of claim 1, wherein the organic ligand comprises a C1-C10 moiety that may contain a pendent hydroxyl, vinyl or phenyl group.

7. The method of claim 1, wherein the photosensitive composition further comprises a casting solvent and prior to exposing the photosensitive composition to light in the ultraviolet spectrum, the method comprises thermally curing the photosensitive composition.

8. A method of fabricating a photosensitive composition, the method comprising:

forming a layer comprising metal nanoparticles capped with an organic ligand, wherein the metal nanoparticles comprise a metal species (M) that absorbs light in the extreme ultraviolet spectrum, and wherein each of the metal nanoparticles comprises a six-membered —M—M—M—M —M—M— ring.

9. The method of claim 8, wherein the metal nanoparticles comprise the metal species (M) selected from bismuth, indium, antimony, germanium, aluminum and tin.

10. The method of claim 8, wherein the metal nanoparticles comprises an average diameter of 5 nanometers or less.

11. The method of claim 10, wherein a size distribution of the metal nanoparticles comprise a size distribution of plus or minus one nanometer.

12. The method of claim 8, wherein the organic ligand is operable to decompose or crosslink upon exposure to ultraviolet light.

13. The method of claim 12, wherein the organic ligand comprises a C1-C10 moiety that may contain a pendant hydroxyl, vinyl or phenyl group.

14. The method of claim 8, wherein the layer further comprises a casting solvent, wherein the metal nanoparticles are dispersed in the casting solvent.

* * * * *